United States Patent [19]

Mukutmoni

[11] Patent Number: 4,837,525
[45] Date of Patent: Jun. 6, 1989

[54] TRANSIENT WAVEFORM GENERATOR

[75] Inventor: Tapas Mukutmoni, Anaheim, Calif.

[73] Assignee: McDonnell Douglas Corporation, Long Beach, Calif.

[21] Appl. No.: 168,448

[22] Filed: Mar. 15, 1988

[51] Int. Cl.⁴ .......................................... H03B 11/00
[52] U.S. Cl. .................................. 331/165; 331/143; 328/66
[58] Field of Search .............. 331/111, 143, 165, 167; 328/59, 60, 61, 62, 66; 307/109, 260

[56] References Cited

U.S. PATENT DOCUMENTS

| | | |
|---|---|---|
| 3,579,111 | 5/1971 | Johannessen .................. 331/165 X |
| 3,909,624 | 9/1975 | Strickland . | |
| 4,126,860 | 11/1978 | Sullivan et al. . |
| 4,217,468 | 8/1980 | Rice et al. . |
| 4,220,907 | 9/1980 | Pappas et al. . |
| 4,356,487 | 10/1982 | Herbreteau . |
| 4,422,044 | 12/1983 | Mueller . |
| 4,430,577 | 2/1984 | Bouguet . |
| 4,536,723 | 8/1985 | Lang et al. . |

Primary Examiner—Eugene R. LaRoche
Assistant Examiner—Robert J. Pascal
Attorney, Agent, or Firm—Curtis L. Harrington; George W. Finch; John P. Scholl

[57] ABSTRACT

A transient waveform generator capable of generating waveforms having operator specifiable characteristics, including amplitude, rise time, and phase inversion.

12 Claims, 1 Drawing Sheet

TRANSIENT WAVEFORM GENERATOR

BACKGROUND OF THE INVENTION

This invention relates to a high voltage pulse generator especially useful in testing circuitry and other devices to determine resistance to electromagnetic interference (EMI). More specifically it relates to a waveform generator which has an adjustable waveform characteristic, and a waveform generator having an output whose thevenin characteristics are readily measured.

Circuits and electrical devices built for both commercial and military applications are increasingly susceptible to the harmful effects of electromagnetic interference which range from simple distortion to complete destruction. This is in part because of the trend toward lower logic signal levels in electronic systems involving sensitive devices such as microprocessors, comparitors, and gate arrays. Whether the EMI is inductive or conductive, the result is the production of voltage transients within the device of interest. Voltage transient testing techniques often include the construction of the whole system and testing it under actual conditions, which is both expensive and difficult. If the expected voltage transients can be introduced directly into the device to be tested to the degree expected to be encountered under actual conditions, the testing which results from such introduction should give a sufficient indication of stability.

Currently available devices for transient voltage waveform testing are complex and expensive. Available devices are designed to produce only one type of waveform. Consequently, a testing program which necessitates the exposure of a device to several types of transient waveforms involves the use of several devices and the concomitant connection and disconnection procedures to be used with each waveform generator. Another major dissatisfaction with currently available waveform generators is their burdensome cost. The cost of production of a device to be tested to stringent specifications is increased both by the cost of test equipment and the labor required in sequentially connecting various waveform generators to the device to be tested.

Another problem with commercially available waveform generators is the means with which the produced waveform is measured. A test waveform may have a high amplitude and a short duration output making the accurate measurement of the output difficult. The characterization of the output is important in order to insure that the specified test of the requisite severity was applied to the circuit. The additional circuitry to be added to the test device necessary to characterize the generated waveform further adds to the cost of both the waveform generator and the device being tested.

Another problem with currently available waveform generators is high internal impedance. Typically, the more complex a waveform generator is the higher its internal impedance. Therefore, the complexity necessary to produce a tailored waveform will also create unwanted internal impedance. Internal impedance mitigates the effect of the pulse on the device tested, causing the device to test to a lesser specification than desired.

SUMMARY OF THE INVENTION

The device and method of the present invention provides for an inexpensive waveform generator. The estimated cost of constructing a transient waveform generator according to the present invention is estimated to be about one third the cost of a currently commercially available device. The waveform characteristics of the generated waveform can be altered with the adjustment of two resistances connected to a three winding transformer. The circuitry of the current invention is constructed using as few components possible for simplicity and economy.

The output is designed to allow the thevenin characteristics of the output waveform to be easily and accurately obtained. The output terminals of the waveform generator are connected across a series combination of a resistor and the output winding of the output transformer. The open circuit voltage is obtained by triggering the waveform generator and measuring the voltage across the output terminals of the waveform generator. The closed circuit current is ascertained by triggering the waveform generator and measuring the close circuit current through the waveform generator output terminals. The resulting thevenin resistance may then be calculated. The ability to measure the thevenin characteristics is important because current testing specifications require a maximum total impedance associated with the source of the transient waveform.

Although the device and process of the present invention has been constructed to deliver a transient waveform having an amplitude of about 575 volts, it is apparent that the component values utilized can be selected to allow a waveform of any desired magnitude.

The present invention has a triple winding air core magnetic energy transfer network, including a series resistance connected to each winding. The two input windings are counter wound to produce opposing magnetic fields. The output winding also has a series connected resistance. Control of these resistances enables control of the output transient waveform rise time, oscillation frequency, and damping.

The components of the present invention provide for a lightweight, portable unit. This is especially advantageous in that it can be transported easily to the test location. Electronic systems already installed aboard aircraft can be tested without the necessity for removal. In addition, systems can be tested simultaneously. The effect of introducing an electromagnetic waveform into one component of a system can be measured on other system components.

DESCRIPTION OF THE PREFERRED EMBODIMENT

Figure 1:
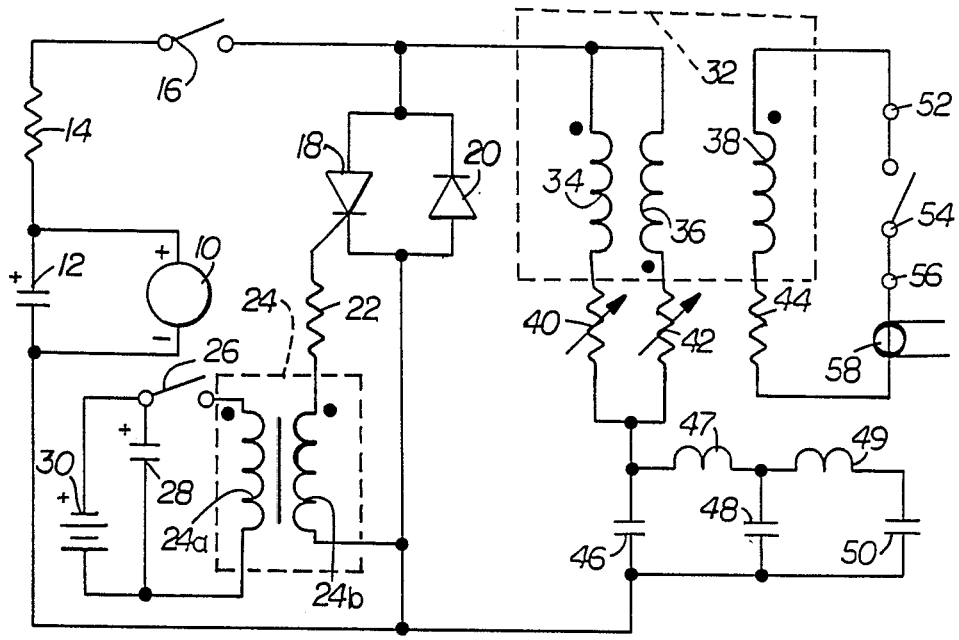
FIG. 1 is a schematic of the circuit of the present invention.

Since an important aspect of the invention lies in its ability to provide a transient waveform at low impedance, values for the components of the circuit will be set forth in a Table I which follows after a description of FIG. 1.

Referring to FIG. 1, the circuit schematic includes a suitable high voltage source 10. A capacitor 12 is connected in series with the output terminals of high voltage source 10. A resistor 14 is connected to the higher potential terminal of high voltage source 10. The other end of resistor 14 is connected to one terminal of a charging switch 16. The other terminal of charging switch 16 is connected both to the current input terminal of a silicon controlled rectifier (SCR) 18, and to the current output terminal of a diode 20. The current output end of silicon controlled rectifier 18 is connected to the current input end of diode 20, and both are connected to the more negative terminal of high voltage source 10.

The firing gate of SCR 18 is connected to one end of a resistor 22. The other end of resistor 22 is connected to the dotted end of a secondary winding 24b of a triggering transformer 24. The undotted end of a secondary winding 24b of triggering transformer 24 is connected to the more negative terminal of high voltage source 10.

The primary winding 24a of triggering transformer 24 has its dotted terminal connected to one end of a triggering switch 26. A capacitor 28 is connected in parallel between the other end of triggering switch 26 and the undotted terminal of the primary winding 24a of triggering transformer 24. A battery 30 is also connected in parallel between the other end of triggering switch 26 and the undotted terminal of the primary winding 24a of triggering transformer 24.

A three winding, air core magnetic energy transfer network, or transformer 32 is connected to the other terminal of charging switch 16 by means of a first primary winding 34 and a second primary winding 36. First primary winding 34 and a second primary winding 36 are positioned to inductively communicate with secondary winding 38. First primary winding 34 and a second primary winding 36 have terminals which are oppositely dotted. The terminals of secondary winding 38 are dotted identically with the terminals of first primary winding 34.

The other end of first primary winding 34 is connected to one end of a variable resistor 40. The other end of second primary winding 36 is connected to one end of a variable resistor 42. The other end of secondary winding 38 is connected to one end of a resistor 44. The other ends of variable resistors 40 and 42 which are not connected to windings 34 and 36 of transformer 32 are connected to the first end of a first charging capacitor 46, and to one end of an inductor 47.

The other end of inductor 47 is connected to the first end of a second charging capacitor 48. Second charging capacitor 48 is shunted by the series connected combination of an inductor 49 and a third charging capacitor 50.

The ends of first, second and third charging capacitors 46, 48, and 50 which are not connected to inductors 47 and 49, are connected to the more negative terminal of high voltage source 10.

Referring back to transformer 32, the dotted terminal of secondary winding 38 is connected to a first test port 52. First test port 52 is connected to one end of a thevenin test switch 54. The other end of thevenin test switch 54 is connected to second test port 56. Second test port 56 is connected to the other end of resistor 44. A current testing coil 58 is provided around the electrical connection between second test port 56 and the other end of resistor 44.

TABLE I

| COMPONENT | VALUE |
|---|---|
| voltage source 10 | 575 volts |
| capacitor 12 | 3 uF |
| resistor 14 | 15k ohm |
| resistor 22 | 1 ohm |

TABLE I-continued

| COMPONENT | VALUE |
|---|---|
| capacitor 28 | 1.5 uF |
| battery 30 | 9 volts |
| first primary winding 34 | 2.2 uH |
| second primary winding 36 | 1.7 uH |
| secondary winding 38 | 2.6 uH |
| resistor 40 | set to .15 ohm |
| resistor 42 | set to 350 ohm |
| resistor 44 | 0.200 ohms |
| capacitor 46 | .005 uF |
| capacitor 48 | .022 uF |
| capacitor 50 | .030 uF |

Figure 2:
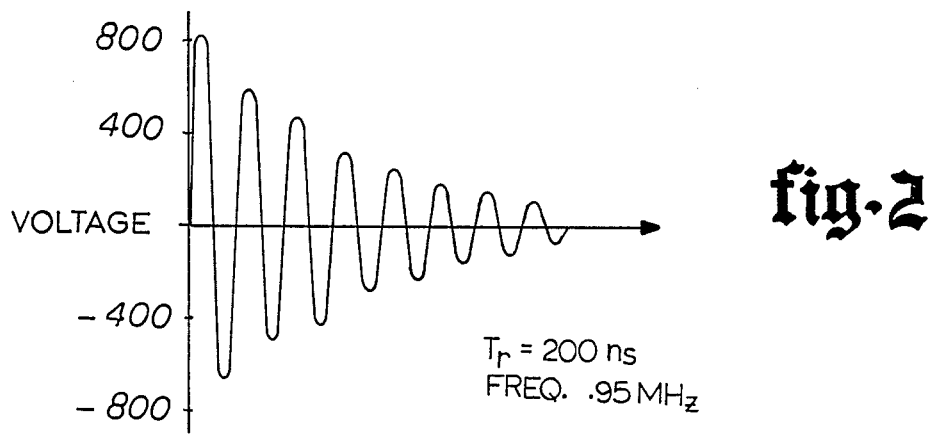
FIG. 2 is a diagram of the voltage profile of the output waveform producible using the circuit of FIG. 1.

FIG. 2 illustrates the open circuit voltage profile of the transient waveform produced using the circuit of FIG. 1. As is shown, the voltage output of the first peak is about 800 volts. The rise time $T_r$ is about 200 nanoseconds. Rise time is the time required for the voltage to rise from 10% of its final value to 90% of its final value. Note that the amplitude diminishes over time.

Figure 3:
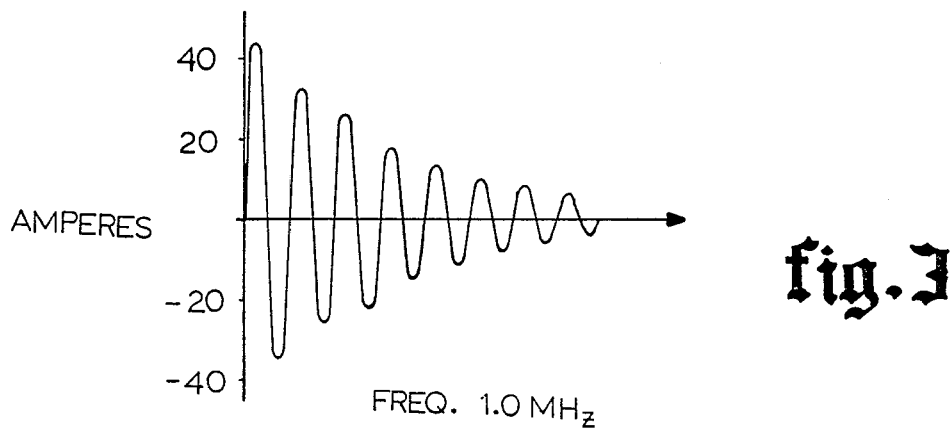
FIG. 3 is a diagram of the current profile of the output waveform producible using the circuit of FIG. 1.

FIG. 3 illustrates the closed circuit current profile of the transient waveform produced using the circuit of FIG. 1. The phase follows the voltage profile of FIG. 2. The first peak reaches a maximum of about 40 amperes. From the open circuit voltage profile of FIG. 2 and the closed circuit current profile of FIG. 3, the thevenin resistance can be calculated. Here it is 800 volts / 20 amperes = 20 ohms.

The operation of the circuit of the present invention begins with charging switch 16 and trigger switch 26 in the open position. A high voltage field is produced at high voltage source 10. Capacitor 12 charges to a voltage equivalent to the voltage at high voltage source 10 until capacitor 12 is fully charged. At this point, silicon controlled rectifier 18 has not been triggered and is in the closed or non conducting state.

Next, charging switch 16 is closed, making the voltage potential of high voltage source 10 available to the remainder of the circuit. Current begins to flow through resistor 14 and closed charging switch 16. Since silicon controlled rectifier 18 is non conducting, no current flows through it. Since diode 20 is reverse biased with respect to the higher potential appearing through charging switch 16, no current flows through diode 20.

Current flows through first and second primary windings 34 and 36 of transformer 32 and then through variable resistors 40 and 42 respectively. The current then flows into and causes the charging of first, second and third charging capacitors 46, 48, and 50. Current flows directly to first charging capacitor 46, but must reach second charging capacitor 48 through inductor 47. Current reaching third charging capacitor 50 must flow through inductors 47 and 49.

After a short period of time first, second and third charging capacitors 46, 48, and 50 are fully charged. Once charging is complete, charging switch 16 is opened. The circuit is now ready to produce a transient waveform. Battery 30 keeps capacitor 28 charged wherever triggering switch 26 is open. Capacitor 28 is for the purpose of providing a ready source of current to the primary winding 24a of triggering transformer 24.

When triggering switch 26 is closed, current flows through the primary winding 24a of triggering transformer 24 creating a positive voltage potential at the dotted terminal of primary winding 24a. A positive voltage potential is inductively induced in the secondary winding 24b at its dotted terminal. This positive voltage potential is transmitted through resistor 22 to the gate of SCR 18. A positive potential at the gate of SCR 18 causes it to close circuit and conduct current away from transformer 32. The current flows due to the discharge of charging capacitors 46, 48, and 50 through transformer 32 in a first direction through SCR 18. Because current does not instantaneously cease flowing through the inductive primary windings 34 and 36 of transformer 32, the current continues to flow after the charging capacitors 46, 48, and 50 are discharged. This causes the charging capacitors 46, 48, and 50 to become oppositely charged with respect to the polarity held during the initial charge. Once charging capacitors 46, 48, and 50 are fully oppositely charged to the extend that the current flow ceases, they begin to discharge again in a second direction through diode 20. This discharge continues until the charging capacitors 46, 48, and 50 are fully charged to the extend that the current ceases flowing in the second direction through diode 20. Once the current flow ceases flowing in the second direction through diode 20, the charging capacitors 46, 48, and 50 begin to discharge again in a first direction through SCR 18. This charging and discharging process continues until the energy losses in the system diminish the charging potentials and current flows of the system to zero. It is the shifting current flows which cause the exponentially decaying sinusoid shown in FIG. 2 and FIG. 3.

The energy from the discharge of the charging capacitors 46, 48, and 50 and current flow through first and second primary windings 34 and 36 of transformer 32 is inductively transmitted to secondary winding 38 of transformer 32. As the inductive energy is transferred, secondary winding 38 of transformer 32 develops a voltage potential which is transmitted to first test port 52 with respect to second test port 54.

The device sought to be tested is connected between first test port 52 and second test port 56. The voltage potential of first test port 52 with respect to second test port 56 will be transmitted to the test device. The current induced in secondary winding 38 will flow through first test port 52, the test device, second test port 56, resistor 44, and back into secondary winding 38.

The adjustment of the shape of the waveforms illustrated in FIGS. 1 and 2 is accomplished by varying the variable resistors 40 and 42. Note that the first primary winding 34 and the second primary winding 36 are dotted to indicate opposite inductive polarity. Inductive forces generated in first primary winding 34 tend to oppose and neutralize the inductive forces generated in second primary winding 36. However, inductive forces depend upon current flow. Variable resistor 40 assists in controlling the current flow in first primary winding 34, while variable resistor 42 assists in controlling the current flow in second primary winding 36. If the parallel connected first primary winding 34 and second primary winding 36 had the same values of inductance and had no series resistances, or each had the same value of inductance, and had equal resistance values connected in series with each of them, the inductive forces of each winding would cancel each other, and no net inductive force would be available for transmission to secondary winding 38 of transformer 32. Note that, from the above table, the inductance of first primary winding 34 differs from the inductance of second primary winding 36. By selecting the inductance values of the first and second primary windings 34 and 36 to bias the inductive transfer without having to wholly rely upon the relative difference between the resistors connected in series with the windings, the total resistance of the primary windings 34 and 36 can be reduced. Since the resistance of the primary windings 34 and 36 are reflected across transformer 32 to the secondary windings, any reduction in the resistance of the primary windings 34 and 36 will reduce the impedance of the transient waveform generated across first and second test ports 52 and 56 respectively.

Setting aside from the values of inductance of the primary windings 34 and 36, and the values of variable resistors 40 and 42 appearing in the above table, and considering primary windings 34 and 36 of identical inductance, in general the waveform produced will have a phase dependent upon the ratio of the two resistors 40 and 42. If the ratio of resistor 40 with respect to 42 is greater than unity, the first peak of the transient waveform produced will be in the positive direction. If the ratio of resistor 40 with respect to 42 is less than unity, the first peak of the transient waveform produced will be in the negative direction.

The relative magnitudes of resistors 40 and 42 with respect to each other control the rise time, $T_r$, of the transient waveform. If difference in magnitude between the variable resistors 40 and 42 is slight, the transient waveform will have a short rise time. This will result in a steep slope for the rising transient. If difference in magnitude between the variable resistors 40 and 42 is great, the transient waveform will have a long rise time. This will result in a gradual slope for the rising transient. The frequency of the transient waveform produced will be the resonant frequency which is dependent upon the total reactive values contributed by the inductors and capacitors in the main path of current flow in the circuit which can be calculated.

It is evident that the circuit of the present invention does not require expensive, complex self monitoring sensors in order to ascertain the quantitative characteristics of the generated transient waveform. The thevenin characteristics are readily obtained directly from the circuit configuration of the present invention. First and second output ports 52 and 56 are connectable by thevenin test switch 54 to form a closed loop for current flow through secondary winding 38, resistor 44, and thevenin test switch 54 when closed. As previously discussed, a current testing coil 58 is provided around the electrical connection between second test port 56 and the other end of resistor 44. When thevenin test switch 54 is closed and a transient waveform is generated, the current resulting therefrom can be inductively sensed through current testing coil 58 connected to an appropriate testing device (not shown). Such a testing device could be an oscilloscope, for example.

Similarly, with thevenin test switch 54 open, the open circuit voltage can be measured, the thevenin resistance can be calculated by dividing the thevenin voltage by the thevenin current. This thevenin resistance would be the true resistance to which the device under test would be exposed. These steps could be performed repeatedly using different resistance values for variable resistors 40 and 42 until the desired quantitative characteristics for the transient waveform are achieved.

The foregoing disclosure and description of the invention are illustrative and explanatory thereof, and various changes in the values, tolerances, power ratings and specifications of the circuit components, as in details of the illustrated construction may be made without departing from the spirit and scope of the invention.

What is claimed is:

1. A transient waveform generator comprising;
   high impedance means for supplying high voltage, having a positive terminal and a negative terminal;
   trigger means for initiating said generator transient waveform, shunted across said high impedance means;
   inductive transfer means for transmitting and controlling said generated transient waveform; and
   resonance inducing means, connected to said inductive transfer means, for inducing resonance with said inductive transfer means.

2. The transient waveform generator of claim 1 wherein said high impedance means for supplying high voltage further comprises;
   a high voltage direct current power supply
   a power supply capacitor shunted across said power supply; and
   a high resistance resistor connected in series with said high voltage power supply.

3. The transient waveform generator of claim 2 wherein the voltage of said power supply is in the range of about 550 to 600 volts.

4. The transient waveform generator of claim 1 wherein said trigger means further comprises:
   a diode having a cathode connected to said positive terminal of said high impedance means for supplying voltage, and an anode;
   a silicon controlled rectifier having a gate, an anode connected to said positive terminal of said high impedance means for supplying voltage, and a cathode connected to said anode of said diode;
   a series resistor having a first and a second end, said first end connected to said gate of said silicon controlled rectifier;
   a pulse transformer having a primary coil and a secondary coil, each having a dotted and an undotted end, the dotted end of said secondary coil connected to said second end of said series resistor, the undotted end of said secondary coil connected to said cathode of said silicon controlled rectifier;
   a switch having first end connected to said dotted end of said primary coil of said pulse transformer, and a second end;
   a pulse transformer shunting capacitor having a first end connected to said second end of said switch, and a second end connected to said undotted end of said primary coil; and
   a low voltage source having a higher potential connected to said first end of said pulse transformer shunting capacitor and a lower potential connected to said second end of said pulse transformer shunting capacitor.

5. The transient waveform generator of claim 4 wherein said low voltage source is a battery.

6. The transient waveform generator of claim 1 wherein said inductive transfer further comprises:
   an inductive transfer unit having a primary coil, a secondary coil, and a tertiary coil, each having a dotted end and an undotted end, the dotted end of said primary coil, and the undotted end of said secondary coil, connected to said positive terminal of said high impedance means for supplying high voltage;
   a test switch having a first end connected to said dotted end of said tertiary coil of said inductive transfer unit, and a second end;
   a first resistor having a first end connected to said undotted end of said primary coil of said inductive transfer unit and a second end;
   a second resistor having a first end connected to said dotted end of said secondary coil of said inductive transfer unit, and a second end connected to the said second ends of said first resistor and to said resonance inducing means; and
   a third resistor having a first end connected to said undotted end of said tertiary coil of said inductive transfer unit, and a second end connected to said second end of said test switch.

7. The transient waveform generator of claim 6 wherein said inductive transfer unit has an air core.

8. The transient waveform generator of claim 1 wherein said resonance inducing means further comprises:
   a first resonance capacitor having a first end connected to said inductive transfer means, a second end connected to said negative terminal of said high impedance means for supplying a high voltage;
   a first resonance inductor having a first end connected to said first end of said first resonance capacitor, and a second end;
   a second resonance capacitor shunting said second end of said first resonance inductor and said second end of said first resonance capacitor;
   a second resonance inductor having a first end connected to said second end of said of said first resonance inductor, and a second end; and
   a third resonance capacitor having a first end connected to said second end of said second resonance inductor, and a second end connected to said second ends of said first and said second resonance capacitors and to said negative terminal of said high impedance means for supplying a high voltage.

9. The process of producing a transient waveform comprising the steps of:
   charging the capacitors of a resistive inductive capacitive loop to a high voltage potential;
   discharging said capacitors through the resistors and inductors of said resistive inductive capacitive circuit and a silicon controlled rectifier; and,
   inductively transmitting the energy associated with the discharge of said capacitors from said inductors of said resistive inductive capacitive circuit to a test port inductor across which the transient waveform is produced.

10. The process of producing a transient waveform as in claim 9 and further the process of determining the thevenin characteristics of the transient waveform so produced, further comprising the steps of:
   measuring the voltage produced across said test port inductor;
   charging the capacitors of said resistive inductive capacitive to a high voltage potential;
   short circuiting the ends of said test port inductor;
   discharging said capacitors through said resistors and inductors of said resistive inductive capacitive circuit and a silicon controlled rectifier;
   inductively transmitting the energy associated with the discharge of said capacitors from said inductors of said resistive inductive capacitive circuit to said test port inductor across which the transient waveform is produced; and, measuring the current produced in said test port inductor.

11. The process of producing a transient waveform as in claim 9 wherein the discharging said capacitors step further comprises the steps of:
- transmitting a low voltage pulse across a transformer; and,
- conducting said transmitted low voltage pulse from said transformer to said silicon controlled rectifier causing said silicon controlled rectifier to discharge said capacitors of said resistive inductive capacitive circuit.

12. The process of producing a transient waveform as in claim 9 and altering the characteristics of said transient waveform further comprising the steps of:
- varying the resistance of said resistor of said resistive inductive capacitive circuit; and,
- varying the degree of inductive transmission of said energy associated with the discharge of said capacitors.

* * * * *

UNITED STATES PATENT AND TRADEMARK OFFICE
CERTIFICATE OF CORRECTION

PATENT NO. : 4,837,525
DATED : Jun. 6, 1989
INVENTOR(S) : Tapas Mukutmoni

It is certified that error appears in the above-identified patent and that said Letters Patent is hereby corrected as shown below:

In column 5, line 14, the word [extend] should be extent.

In column 5, line 18, the word [extend] should be extent.

In column 6, line 55, after the word measured insert across first and second test ports 54 and 56. Once the closed circuit current, or thevenin current, and the open circuit, or thevenin voltage is measured.

Signed and Sealed this

Seventeenth Day of July, 1990

Attest:

HARRY F. MANBECK, JR.

*Attesting Officer*     *Commissioner of Patents and Trademarks*